United States Patent
Lee et al.

(10) Patent No.: US 10,249,358 B1
(45) Date of Patent: Apr. 2, 2019

(54) APPARATUSES AND METHODS FOR CONFIGURABLE COMMAND AND DATA INPUT CIRCUITS FOR SEMICONDUCTOR MEMORIES

(71) Applicant: MICRON TECHNOLOGY, INC., Boise, ID (US)

(72) Inventors: Hyun Yoo Lee, Boise, ID (US); Kang-Yong Kim, Boise, ID (US); John D. Porter, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/190,504

(22) Filed: Nov. 14, 2018

Related U.S. Application Data

(62) Division of application No. 15/590,972, filed on May 9, 2017, now Pat. No. 10,153,030.

(51) Int. Cl.
| | |
|---|---|
| *G11C 7/22* | (2006.01) |
| *G11C 11/4076* | (2006.01) |
| *G11C 11/4096* | (2006.01) |
| *G11C 7/10* | (2006.01) |
| *G11C 11/4074* | (2006.01) |
| *G11C 11/4093* | (2006.01) |
| *G11C 11/4091* | (2006.01) |

(52) U.S. Cl.
CPC .......... *G11C 11/4076* (2013.01); *G11C 7/106* (2013.01); *G11C 7/1066* (2013.01); *G11C 7/222* (2013.01); *G11C 11/4074* (2013.01); *G11C 11/4093* (2013.01); *G11C 11/4096* (2013.01); *G11C 7/1072* (2013.01); *G11C 7/22* (2013.01); *G11C 11/4091* (2013.01); *G11C 2207/2227* (2013.01); *G11C 2207/2272* (2013.01)

(58) Field of Classification Search
CPC .......... G11C 7/22; G11C 7/1072; G11C 7/222
USPC ............... 365/233.1, 233.12, 222, 185.25
See application file for complete search history.

(56) References Cited

U.S. PATENT DOCUMENTS

| | | | |
|---|---|---|---|
| 9,384,818 | B2 | 7/2016 | Adelman et al. |
| 9,384,847 | B2 | 7/2016 | Gillingham et al. |
| 2007/0086267 | A1 | 4/2007 | Kwak |
| 2007/0210841 | A1* | 9/2007 | Kim ............... G11C 7/1072 327/158 |
| 2015/0243342 | A1 | 8/2015 | Ware |
| 2017/0110173 | A1 | 4/2017 | Matsuno |

OTHER PUBLICATIONS

International Search Report and Written Opinion dated Jul. 17, 2018 for PCT Application No. PCT/US2018/025468, 19 pages.
PCT Application No. PCT/US2018/025468 entitled 'Apparatuses and Methods for Configurable Command and Data Input Circuits for Semiconductor Memories' filed Mar. 30, 2018,.
"JEDEC Standard—Low Power Double Data Rate 4 (LPDDR4)", JEDEC Solid State Technology Association, JESD209-4, Aug. 2014, 196 pgs.

(Continued)

*Primary Examiner* — Jason Lappas
(74) *Attorney, Agent, or Firm* — Dorsey & Whitney LLP

(57) ABSTRACT

Apparatuses and methods for configurable command and data input circuits for semiconductor memories are described. Example apparatuses include input signal blocks, clock blocking circuits, data input blocks, driver circuits, and data receiver circuits.

20 Claims, 8 Drawing Sheets

(56) References Cited

OTHER PUBLICATIONS

"JEDEC Standard—Low Power Double Data Rate 4 (LPDDR4)", JEDEC Solid State Technology Association, JESD209-4A (Revision of JESD209-4A, Aug. 2014), Nov. 2015, 272 pgs.

Lee, et al, "A 1.6 V 1.4 Gbpisipin Consumer DRAM With Self-Dynamic Voltage Scaling Technique in 44 nm CMOS Technology", IEEE Journal of Solid-State Circuits, vol. 47, No. 1, Jan. 2012, 10 pgs.

Song, et al, "A 1.1 V 2y-nm 4.35 Gb/s/pin 8 Gb LPDDR4 Mobile Device With Bandwidth Improvement Techniques", IEEE Journal of Solid-State Circuits, vol. 50, No. 8, Aug. 2015, 15 pages.

\* cited by examiner

APPARATUSES AND METHODS FOR CONFIGURABLE COMMAND AND DATA INPUT CIRCUITS FOR SEMICONDUCTOR MEMORIES

CROSS REFERENCE TO RELATED APPLICATIONS

This application is a divisional of pending U.S. patent application Ser. No. 15/590,972 on May 9, 2017. The aforementioned application is incorporated herein by reference, in its entirety, for any purpose.

BACKGROUND

High data reliability, high speed of memory access, lower power consumption and reduced scaling of chip size are features that are demanded from semiconductor memory. The reduced scaling of the chip size typically results in smaller feature sizes and lower power consumption for the various circuits of semiconductor memory. For example, a memory array, supporting circuits for receiving signals and providing signals, and other circuits used in performing various memory operations may be designed for higher memory and circuit density and reduced power consumption. Lower power consumption is often achieved by using lower internal voltages. However, circuit performance when operating at higher speeds may suffer when lower internal voltages are used. Additionally, operation of circuits at higher speeds (e.g., higher clock frequencies) typically have higher power consumption compared to operating at lower speeds. Thus, circuits are often designed to balance lower power consumption and acceptable performance at higher speeds. It may be desirable to have circuits for semiconductor memories that may be configured to be operated for lower power consumption or for high speed performance.

DETAILED DESCRIPTION

Certain details are set forth below to provide a sufficient understanding of embodiments of the disclosure. However, it will be clear to one skilled in the art that embodiments of the disclosure may be practiced without these particular details. Moreover, the particular embodiments of the disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
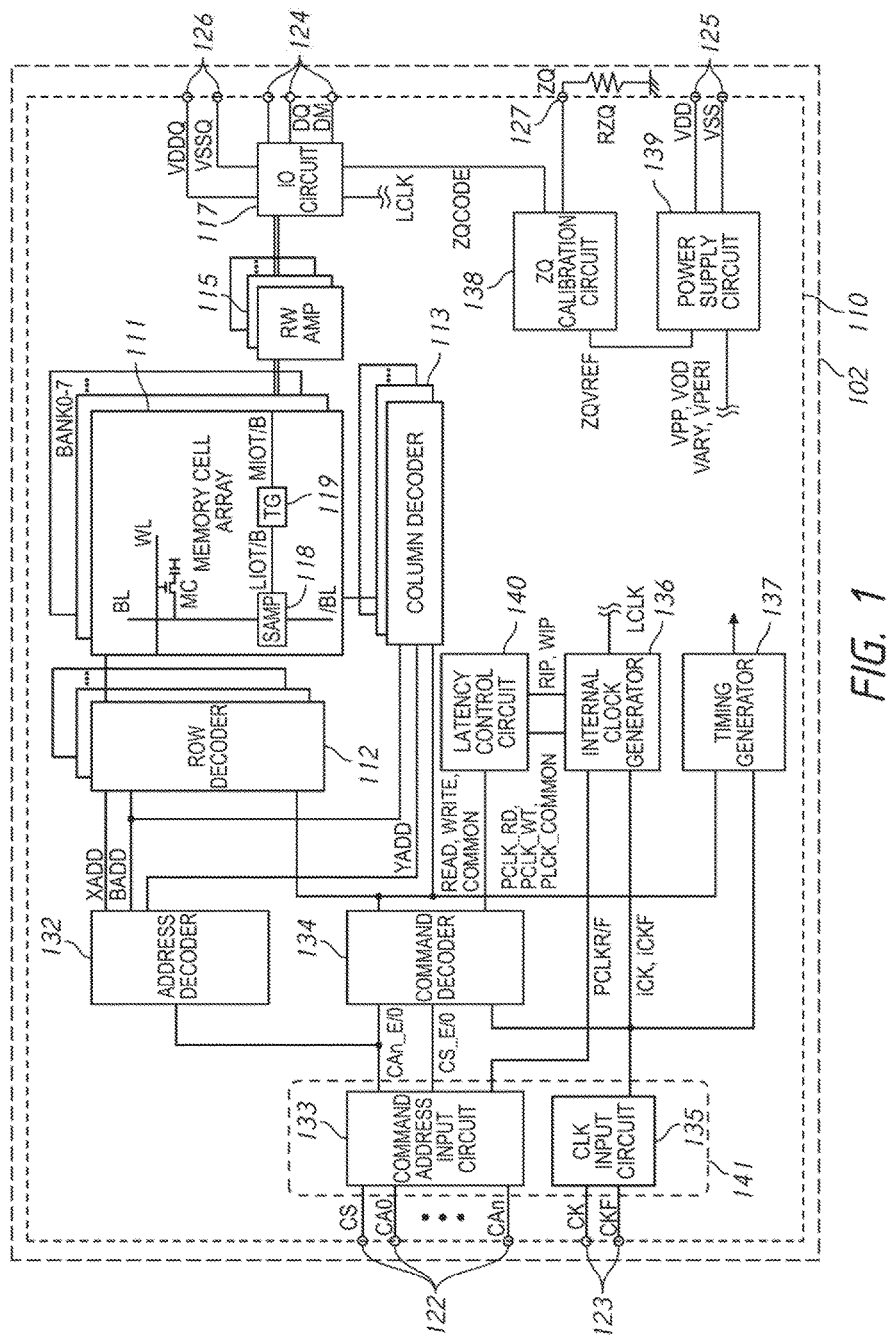
FIG. 1 is a block diagram of a semiconductor device according to an embodiment of the disclosure.

FIG. 1 is a block diagram of a semiconductor device in accordance with the present disclosure. The semiconductor device 110 may be a DDR4 SDRAM integrated into a single semiconductor chip, for example. The semiconductor device 110 may be mounted on an external substrate 102 that is a memory module substrate, a mother board or the like. The external substrate 102 employs an external resistor RZQ that is connected to a calibration terminal ZQ 127 of the semiconductor device 110. The external resistor RZQ is a reference impedance of a ZQ calibration circuit 138. The external resistor RZQ may be coupled to a reference potential, for example, in different embodiments, VSS, VDDQ, VDD, or other potential that may be used as a reference potential.

As shown in FIG. 1, the semiconductor device 110 includes a memory cell array 111. The memory cell array 111 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 112 and the selection of the bit line BL is performed by a column decoder 113. Sense amplifiers 118 are coupled to corresponding bit lines BL and connected to local I/O line pairs LIOT/B. Local IO line pairs LIOT/B are connected to main IO line pairs MIOT/B via transfer gates TG 119 which function as switches.

Turning to the explanation of a plurality of external terminals included in the semiconductor device 110, the plurality of external terminals includes address terminals 121, command terminals 122, clock terminals 123, data terminals 124, power supply terminals 125 and 126, and the calibration terminal ZQ 127. An input signal block 141 may include the address terminals 121, the command terminals 122 and the clock terminals 123 may include input buffers that will be later described in detail, according to one embodiment. The data terminals 124 may be coupled to output buffers for read operations of memories. Alternatively, the data terminals 124 may be coupled to input buffers for read/write access of the memories. FIG. 1 shows an example of dynamic random access memory (DRAM), however, any device having external terminals for signal input/output may be included as the external terminals of embodiments of the present disclosure.

The terminals 122 are supplied with command signals and address signals, which are referred collectively in FIG. 1 as CA0-CAn. The command signals of the CA0-CAn signals may be provided to the terminals 122 at different times from the address signals of the CA0-CAn signals. For example, the terminals 122 may first be supplied with the command signals of the CA0-CAn signals, and then after a command represented by the command signals is complete, the terminals 122 may be supplied with the address signals of the CA0-CAn signals. The address signals of the CA0-CAn signal represent a memory address associated with the command. The terminals 122 are further supplied with a select signal CS. The CS signal may be used to activate the semiconductor device for operation. The command/address signals CA0-CAn may include one or more separate signals.

The command signals of the CA0-CAn signals and the CS signal input to the terminals 122 are input to a command decoder 134 via the command input circuit 133 as CAn_E/O and CS_E/O signals. The command decoder 134 decodes the CAn_E/O signals to generate various internal command signals. For example, the internal commands may include a row command signal to select a word line and a column command signal, such as a read command or a write command, to select a bit line. A latency control circuit 140 receives internal command signals, for example, READ, WRITE, COMMON from the command decoder 134 and receives internal clock signals from the internal clock generator 136. The latency control circuit adds delay to the internal command signals according to a programmed latency. The latency control circuit 140 also provides progress signals to the internal clock generator 136 that are indicative of operations in progress. Address signals of the CA0-CAn signals input to the terminals 122 are input to an address decoder 132. The address decoder 132 receives the address signals and supplies a decoded row address signal XADD to the row decoder 112, and a decoded column address signal YADD to the column decoder 113. The address decoder 132 also receives the bank address signals and supplies bank address signals BADD to the row decoder 112, and the column decoder 113.

When a read command is issued and a row address and a column address are timely supplied with the read command, read data is read from a memory cell MC in the memory cell array 111 designated by these row address and column address. The read data DQ is output externally from the data terminals 124 via a read/write amplifier 115 and an input/output circuit 117. Similarly, when the write command is issued and a row address and a column address are timely supplied with this command, and then write data DQ is supplied to the data terminals 124, the write data DQ is supplied via the input/output circuit 117 and the read/write amplifier 115 to the memory cell array 111 and written in the memory cell MC designated by the row address and the column address.

The clock terminals 123 are supplied with external clock signals CK and /CK, respectively. These external clock signals CK and /CK are complementary to each other and are supplied to a clock input circuit 135. The clock input circuit 135 receives the external clock signals CK and /CK and generates an internal clock signal ICLK. The internal clock signal ICLK is supplied to an internal clock generator 136 and thus a phase controlled internal clock signal LCLK is generated based on the received internal clock signal ICLK and a clock enable signal CKE from the command input circuit 133. Although not limited thereto, a DLL circuit can be used as the internal clock generator 136. The phase controlled internal clock signal LCLK is supplied to the input/output circuit 117 and is used as a timing signal for determining an output timing of the read data DQ. The internal clock signal ICLK is also supplied to a timing generator 137 and thus various internal clock signals can be generated.

The power supply terminals 125 are supplied with power supply potentials VDD and VSS. These power supply potentials VDD and VSS are supplied to an internal power supply circuit 139. The internal power supply circuit 139 generates various internal potentials VPP, VOD, VARY, VPERI, and the like and a reference potential ZQVREF based on the power supply potentials VDD and VSS. The internal potential VPP is mainly used in the row decoder 112, the internal potentials VOD and VARY are mainly used in the sense amplifiers 118 included in the memory cell array 111, and the internal potential VPERI is used in many other circuit blocks. The reference potential ZQVREF is used in the ZQ calibration circuit 138.

The power supply terminals 126 are supplied with power supply potentials VDDQ and VSSQ (or VSS). These power supply potentials VDDQ and VSSQ (or VSS) are supplied to an output buffer (not shown) included in the input/output circuit 117. The power supply potentials VDDQ and VSSQ may be the same potentials as the power supply potentials VDD and VSS that are supplied to the power supply terminals 125, respectively. However, the dedicated power supply potentials VDDQ and VSSQ (or VSS) may be used for the output buffer in the input/output circuit 117 so that power supply noise generated by the input/output circuit 117 does not propagate to the other circuit blocks.

The calibration terminal ZQ is connected to the calibration circuit 138. The calibration circuit 138 performs a calibration operation with reference to an impedance of an external resistance RZQ and the reference potential ZQVREF when activated. An impedance code ZQCODE obtained by the calibration operation is supplied to the input/output circuit 117, and thus an impedance of an output buffer (not shown) included in the input/output circuit 117 is specified.

Figure 2:
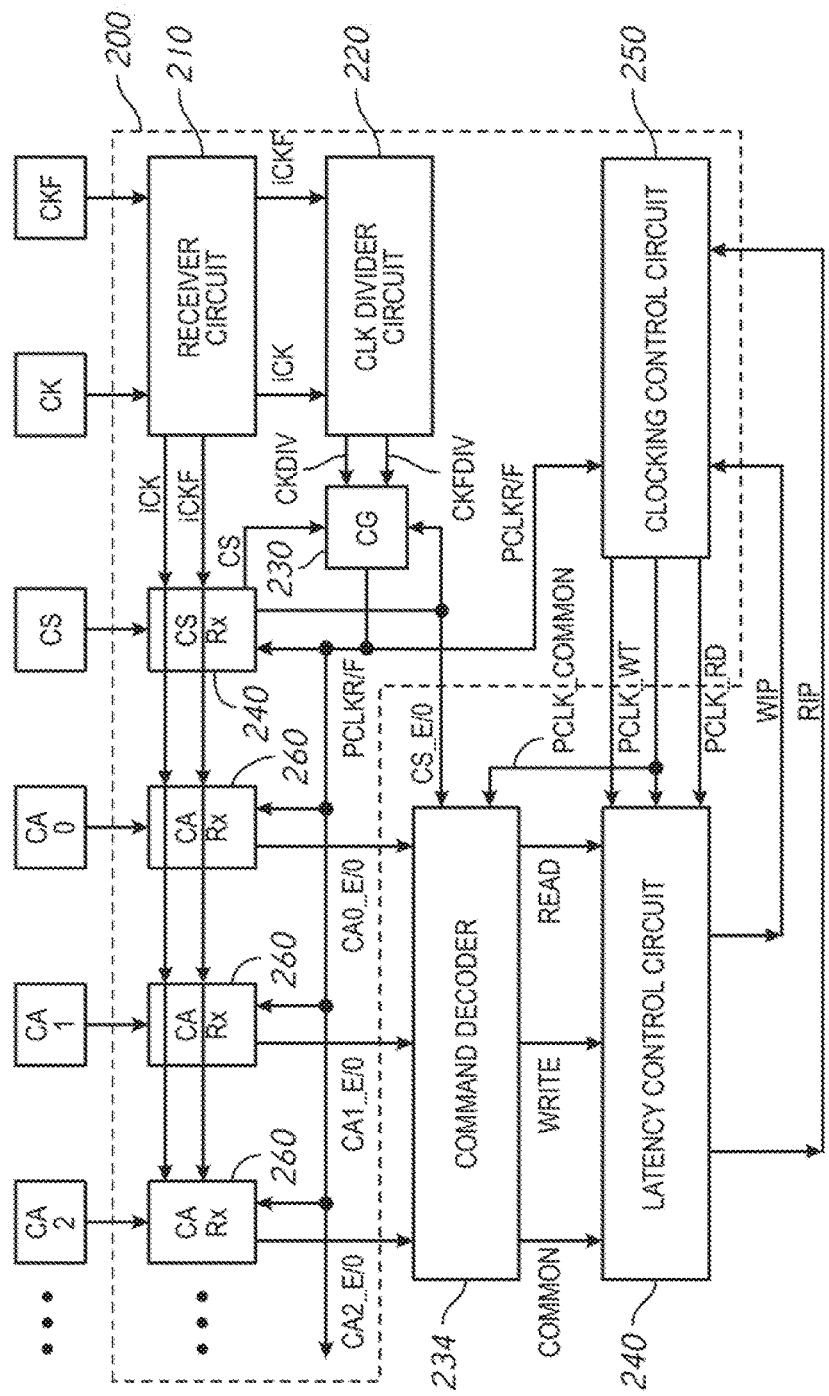
FIG. 2 is a block diagram of an input signal block according to an embodiment of the disclosure.

FIG. 2 is a block diagram of an input signal block 200 according to an embodiment of the disclosure. In some embodiments of the disclosure, portions of the input signal block 200 are included in the command input circuit 133, the clock input circuit 135, and the internal clock generator 136.

The input signal block 200 includes clock receiver circuit 210 that receives complementary clock signals CK and CKF from external terminals and provides complementary internal clock signals iCK and iCKF. The iCK and iCKF signals are provided to a clock divider circuit 220. The clock divider circuit 220 receives the iCK and iCKF signals and provides complementary clock signals CKDIV and CKFDIV having a clock frequency that is less than the clock frequency of the CK and CKF signals. In some embodiments of the disclosure, the clock frequency of the CKDIV and CKFDIV signals is one-half the clock frequency of the CK and CKF signals.

A clock gating circuit 230 receives the CKDIV and CKFDIV signals from the clock divider circuit 220. The clock gating circuit 230 further receives a select signal CS from an external terminal and provides clock signals PCLKR and PCLKF signals (referenced in FIG. 2 collectively as the PCLKR/F signal) that are based on the CKDIV and CKFDIV signals when activated by an active CS signal. An active CS signal (e.g., a high logic level) is provided to the external terminal to activate, for example, the semiconductor device 110. Conversely, an inactive CS signal is provided to the external terminal to deactivate, for example, the semiconductor device 110. When not activated, the clock gating circuit 230 provides low logic level PCLKR and PCLKF signals. As will be described in more detail below, the clock gating circuit 230 may provide inactive PCLKR and PCLKF signals when the CS signal is not active, and provide active PCLKR and PCLKF signals when the CS signal is active. In this manner, power consumption may be reduced compared to continually providing active PCLKR and PCLKF signals.

The PCLKR and PCLKF signals are provided to a CS receiver circuit 240, CA receivers 260, and a clocking control circuit 250.

The CS receiver circuit 240 is also provided the CS signal from the external terminal and the iCK and iCKF signals from the receiver circuit 210. The CS receiver circuit 240 samples the CS signal according to PCLKR and PCLKF signals and provides internal select signals CS_E and CS_O (referenced in FIG. 2 collectively as the CS_E/O signal). The logic level of the CS signal may be sampled by the CS receiver circuit 240. The CS_E and CS_O signals have the logic level of the CS signal at the time sampled according to the PCLKR and PCLKF signals. For example, the CS_E signal has the logic level of the CS signal when the PCLKR signal changes from a low clock level to a high clock level, and the CS_O signal has the logic level of the CS signal when the PCLKF changes from a low clock level to a high clock level. The CS_E and CS_O signals may be provided by the input signal block 200 to a command decoder 234, for example, which may be implemented by the command decoder 134.

The CA receiver circuits 260 receive respective command/address CAn signals from external terminals and receive the iCK and iCKF signals from the receiver circuit 210. The CA receiver circuits 260 sample the respective CAn signal to provide respective internal signals CAn_E and CAn_O (referenced in FIG. 2 collectively as the CAn_E/O signal). The reference "n" is used to generally reference any of the CAn signals, and any of the CAn_E and CAn_O signals, and to show correspondence between the signals. For example, the CA0 signal is provided to a respective CA receiver circuit 260, which provides CA0_E and CA0_O signals; the CA1 signal is provided to a respective CA receiver circuit 260, which provides CA1_E and CA1_O signals, and so on for each of the signals of the CAn signals. While FIG. 2 shows three CA receiver circuits 260, there may be greater or fewer CA receiver circuits 260 without departing from the scope of the disclosure. The CAn_E/O signals are provided to command decoder 234, which decodes the CAn_E/O signals and provides internal control signals to perform operations requested by the CAn signals. Examples of internal control signals provided by the command decoder 234 are represented by READ signals for performing read operations, WRITE signals for performing write operations, and COMMON signals for performing operations other than the read and write operations, for example, refresh operations, activation operations, precharge operations, as well as other operations.

As will be described in more detail below, the CS receiver circuit 240 and the CA receiver circuits 260 may operate in a first mode to sample the CS signal and the CAn signals at a first clock frequency and may operate in a second mode to sample the CS signal and the CAn signals at a second clock frequency that is higher than the first clock frequency. Operating in the second (higher frequency) mode may provide benefits with regards to setup and hold margins for sampling the signals but at the cost of relatively higher power consumption compared to operating in the first (lower frequency) mode. The CS receiver circuit 240 and the CA receiver circuits 260 may be operated in the first or second modes depending on the desire for improved timing margins or lower power consumption.

The clocking control circuit 250 also receives the PCLKR and PCLKF signals from the clock gating circuit 230 and provides clock signals PCLK_WT, PCLK_RD, and PCLK_COMMON. The PCLK_WT, PCLK_RD, and PCLK_COMMON signals are based on the PCLKR and PCLKF signals, and on the write in progress WIP and read in progress RIP signals provided by a latency control circuit 240. The PCLK_WT, PCLK_RD, and PCLK_COMMON signals are provided to the latency control circuit 240. The latency control circuit 240 may be the latency control circuit 140 of FIG. 1. The RIP signal is active (e.g., a high logic level) when a read operation is in progress and the WIP signal is active (e.g., a high logic level) when a write operation is in progress. As will be described in more detail below, the clocking control circuit 250 may provide an inactive PCLK_WT signal when a read operation is in progress and/or provide an inactive PCLK_RD signal when a write operation is in progress. An active clock periodically clocks between high and low clock levels, and an inactivate clock signal maintains either the high or low clock levels. Providing inactive PCLK_WT and PCLK_RD signals may reduce power consumption compared to providing active PCLK_WT and PCLK_RD signals regardless of the access operation (e.g., read operation or write operation) in progress.

Figure 3:
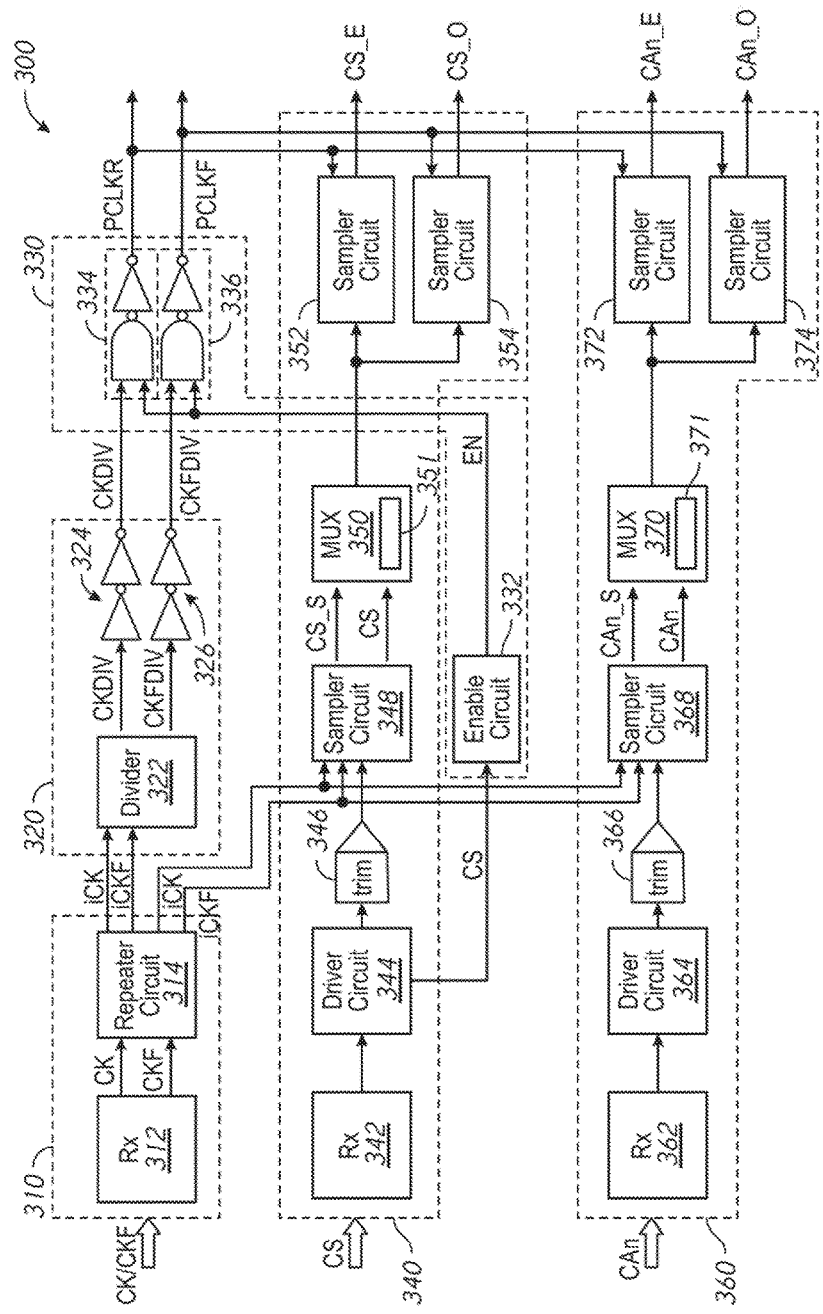
FIG. 3 is a block diagram of an input signal block according to an embodiment of the disclosure.

FIG. 3 is a block diagram of an input signal block 300 according to an embodiment of the disclosure. The input signal block 300 may be used for the input signal block 200 of FIG. 200 in some embodiments of the disclosure. The input signal block 300 receives complementary clock signals CK and CKF, a select signal CS, and command/address signals CAn. As will be described in more detail below, the input signal block 300 may be operated in a first mode to sample the CS signal and the CAn signals at a first clock frequency and may be operated in a second mode to sample the CS signal and the CAn signals at a second clock frequency that is higher than the first clock frequency.

As previously discussed, operating at a higher frequency may provide benefits with regards to improved timing margin while operating at a lower frequency may provide benefits with regards to reduced power consumption. While setup and hold margins for sampling the input signals may be better when operating in the second mode using the second clock frequency when compared to sampling at the first clock frequency, operating in the second mode with the higher second clock frequency causes the circuits to consume more power. In some situations, operating in the first mode and sampling at the slower first clock frequency but consuming less power may be acceptable. The mode of operation may be selected through a mode register, where information programmed in the mode register enables the modes of operation.

The input signal block 300 includes clock receiver circuit 310 that receives complementary clock signals CK and CKF and provides internal clock signals iCK and iCKF. The clock receiver circuit 310 includes a receiver 312 that receives the CK and CKF signals and provides corresponding iCK and iCKF signals to repeater circuits 314. The repeater circuits 314 drive the iCK and iCKF signals over signal lines to other circuits. For example, the iCK and iCKF signals are provided by the repeater circuits 314 to a clock divider circuit 320. The repeater circuits 314 may also selectively provide the iCK and iCKF signals to a sampler circuit 348 of a CS receiver circuit 340. The repeater circuits 314 may be controlled to provide or not provide the iCK and iCKF signals to the sampler circuit 348. When the iCK and iCKF clock signals are not used by the sampler circuit 348, the repeater circuits 314 provide inactive iCK and iCKF signals that maintain a constant clock level. Providing the inactive iCK and iCKF signals may lower power consumption compared to continually providing active iCK and iCKF signals.

The clock divider circuit 320 receives the iCK and iCKF signals and provides complementary clock signals CKDIV and CKFDIV having a clock frequency that is less than the clock frequency of the CK and CKF signals. In some embodiments, the clock frequency of the CKDIV and CKFDIV signals is one-half the clock frequency of the CK and CKF signals. The clock divider circuit 320 includes divider circuit 322, and further includes inverter circuits 324 and inverter circuits 326. The divider circuit 322 provides the CKDIV and DKFDIV signals having a reduced clock frequency (e.g., one-half of the clock frequency of the CK and CKF signals). The inverters 324 provide the CKDIV signal and the inverters 326 provide the CKFDIV signal to other circuits.

The CKDIV and CKFDIV signals are provided to a clock gating circuit 330. The clock gating circuit 330 includes an enable circuit 332, and AND logic 334 and 336. The enable circuit 332 receives the select signal CS and provides enable signal EN to the AND logic 334 and 336. The enable circuit 332 provides an active EN signal (e.g., a logic high level) when an active CS signal (e.g., a logic high level) is received. When an active EN signal is provided, the AND logic 334 provides the CKDIV signal as a PCLKR signal and the AND logic 336 provides the CKFDIV signal as a PCLKF signal. The PCLKR and PCLKF signals are complementary. The PCLKR and PCLKF signals may also be described as being 180 degrees out of phase with one another. Conversely, when the AND logic 334 and 336 receive an inactive EN signal, the AND logic 334 provides a low logic level PCLKR signal and the AND logic 336 provides a low logic level PCLKF signal. The PCLKR and PCLKF signals are provided to a CS receiver circuit 340 and to a CA receiver circuit 360.

The CS receiver circuit 340 includes a receiver 342 that receives the CS signal and provides the CS signal to driver circuit 344. A trim circuit 346 receives the CS signal from the driver circuit 344 and adds a delay before providing the delayed CS signal to a sampler circuit 348. The trim circuit 346 is used to match a propagation delay of the clock receiver circuit 310. For example, a propagation delay of the CS signal through the receiver 342, the driver circuit 344, and trim circuit 346 is matched to the propagation delay of the CK and CKF signals through the receiver 312 and repeater circuits 314. The trim circuit 346 can be trimmed to provide the delay needed to match the propagation delay of the clock receiver circuit 310.

In addition to the delayed CS signal from the trim circuit 346, the sampler circuit 348 may receive the iCK and iCKF clock signals from the repeater circuits 314 of the clock receiver circuit 310. The sampler circuit 348 may be controlled to sample the CS signal based on the iCK and iCKF signals and provide an output signal CS_S to a multiplexer circuit 350. The CS_S signal has a logic level indicative of the value of the sampled CS signal. The sampler circuit 348 may also be controlled to provide the delayed CS signal from the trim circuit 346 to the multiplexer circuit 350 without sampling, in effect, bypassing the sampling operation of the sampler circuit 348. When the sampling operation of the sampler circuit 348 is bypassed, power consumption may be reduced compared to the sampler circuit 348 performing the sampling operation of the CS signal. The multiplexer circuit 350 provides either the CS_S signal or the (unsampled) delayed CS signal to sampler circuits 352 and 354.

In some embodiments of the disclosure, the multiplexer circuit 350 includes a delay circuit 351 that adds delay to the (unsampled) delayed CS signal before being provided to the sampler circuits 352 and 354. Delay may be added by the multiplexer circuit 350 when providing the (unsampled) delayed CS signal to the sampler circuits 352 and 354 in order to make up for a timing difference compared to providing the CS_S signal to the sampler circuits 352 and 354. A timing difference may exist because of the delay of the sampler circuit 348 in sampling the delayed CS signal and providing the CS_S signal, which is not present when providing the (unsampled) delayed CS signal. Thus, the delay of the delay circuit 351 adds delay so that the total propagation delay from the output of the trim circuit 346 to the input of the sampler circuits 352 and 354 is the same for providing both the CS_S signal and the (unsampled) delayed CS signal to the sampler circuits 352 and 354.

The sampler circuit 352 samples the output of the multiplexer circuit 350 according to the PCLKR signal from the clock gating circuit 330, and the sampler circuit 354 samples the output of the multiplexer circuit 350 according to the PCLKF signal. That is, when the respective clock signal becomes active, the logic level of the output of the multiplexer circuit 350 is sampled by the sampler circuit, and an output signal having the sampled logic level is provided by the sampler circuit. The sampler circuit 352 provides an internal signal CS_E and the sampler circuit 354 provides an internal signal CS_O. The CS_E and CS_O signals from the sampler circuits 352 and 354 may be provided, for example, to a command decoder circuit, such as command decoder circuit 234 of FIG. 2. The CS receiver circuit may be operated in a first mode where the CS signal is sampled at the clock frequency of the PCLKR and PCLKF signals (e.g., the first clock frequency), or operated in a second mode where the CS signal is sampled at the clock frequency of the iCK and iCKF signals (e.g., the second clock frequency).

The CS receiver circuit 340 may be operated in a first mode where the CS signal is sampled at the clock frequency of the PCLKR and PCLKF signals (e.g., a first clock frequency) or operated in a second mode where the CS signal is sampled at the clock frequency of the iCK and iCKF signals (e.g., a second clock frequency). The PCLKR and PCLKF signals have a lower clock frequency than the iCK and iCKF signals. In some embodiments of the disclosure, the clock frequency of the PCLKR and PCLKF signals is one-half of the clock frequency of the iCK and iCKF signals. Sampling the CS signal at the higher clock frequency of the iCK and iCKF signals may improve setup and hold timing margins for sampling. The CS_S signal provided by the sampler 348 is then sampled again by the sampler circuits 352 and 354 at the lower clock frequency of the PCLKF and PCLKF signals. The CS_S signal may be more accurate due to the improved timing margins from sampling the CS signal at a higher clock frequency, and from sampling the CS signal earlier in the signal path of the CS receiver circuit 340. The CS signal is subject to less variation in delay (e.g., caused by variations in voltage and/or temperature) by sampling the signal earlier in the signal path of the receiver circuit 340. However, as previously discussed, sampling at the higher clock frequency consumes greater power than sampling at a lower clock frequency. Sampling at the lower clock frequency may be acceptable where lower power consumption is desired. Operating the CS receiver circuit 340 to sample the CS signal at one of the two different clock frequencies allows flexibility to tailor the sampling of the CS signal for better timing margin or lower power consumption as needed.

The CA receiver circuit 360 is similar to the CS receiver circuit 340. That is, the CA receiver circuit 360 samples a CAn signal to provide internal signals CAn_E and CAn_O. While FIG. 3 shows one CA receiver circuit 360, there may be additional CA receiver circuits 360. One CA receiver circuit 360 is provided for each signal of the CA signals. The reference "n" is used to indicate that one of the CA signals is provided to a respective CA receiver circuit 360. For example, the CA0 signal is provided to a respective CA receiver circuit 360, the CA1 signal is provided to a respective CA receiver circuit 360, and so on for each of the signals of the CA signals.

The CA receiver circuit 360 includes a receiver 362 that receives the CAn signal and provides the CAn signal to driver circuit 364. A trim circuit 366 receives the CAn signal from the driver circuit 364 and adds a delay before providing the delayed CAn signal to a sampler circuit 368. The trim circuit 366, as with the trim circuit 346 previously described with reference to the CS receiver circuit 340, is used to match a propagation delay of the receiver circuit 310.

The sampler circuit 368 may also receive the iCK and iCKF clock signals from the repeater circuits 314. The sampler circuit 368 may be controlled to sample the CAn signal based on the iCK and iCKF signals and provide an output signal CAn_S to a multiplexer circuit 370. The CAn_S signal has a logic level indicative of the value of the sampled CAn signal. The sampler circuit 368 may also be controlled to provide the delayed CAn signal from the trim circuit 366 to the multiplexer circuit 370 without sampling, in effect, bypassing the sampling operation of the sampler circuit 368. The multiplexer circuit 370 provides either the CAn_S signal or the (unsampled) delayed CAn signal to sampler circuits 372 and 374.

In some embodiments of the disclosure, the multiplexer circuit 370 includes a delay circuit 371 that adds delay to the (unsampled) delayed CAn signal before being provided to the sampler circuits 372 and 374. Delay may be added by the multiplexer circuit 370 when providing the (unsampled) delayed CAn signal to the sampler circuits 372 and 374 in order to make up for a timing difference compared to providing the CAn_S signal to the sampler circuits 372 and 374. A timing difference may exist because of the delay of the sampler circuit 368 in sampling the delayed CAn signal and providing the CAn_S signal, which is not present when providing the (unsampled) delayed CAn signal. Thus, the delay of the delay circuit 371 adds delay so that the total propagation delay from the output of the trim circuit 366 to the input of the sampler circuits 372 and 374 is the same for both providing the CAn_S signal and the (unsampled) delayed CAn signal to the sampler circuits 372 and 374.

The sampler circuit 372 samples the output of the multiplexer circuit 370 according to the PCLKR signal from the clock gating circuit 330, and the sampler circuit 374 samples the output of the multiplexer circuit 370 according to the PCLKF signal. That is, when the respective clock signal becomes active, the logic level of the output of the multiplexer circuit 370 is sampled by the sampler circuit, and an output signal having the sampled logic level is provided by the sampler circuit. The sampler circuit 372 provides a CAn_E signal and the sampler circuit 374 provides a CAn_O signal. The CAn_E and CAn_O signals from the sampler circuits 372 and 374 may be provided, for example, to a command decoder circuit, such as command decoder circuit 234 of FIG. 2.

As with the CS receiver circuit 340, the CA receiver circuit 360 may be operated in a first mode where the CAn signal is sampled at the clock frequency of the PCLKR and PCLKF signals (e.g., a first clock frequency) or operated in a second mode where the CAn signal is sampled at the clock frequency of the iCK and iCKF signals (e.g., a second clock frequency). The CA receiver circuit 360 and the CS receiver circuit 340 are operated at the same clock frequency, that is, both the CS receiver circuit 340 and the CA receiver circuit 360 are operated to sample at the clock frequency of the iCK and iCKF signals or operated to sample at the clock frequency of the PCLKR and PCLKF signals. As previously described with reference to the CS receiver circuit 340, sampling at the higher clock frequency of the iCK and iCKF signals may improve setup and hold timing margins for sampling compared to sampling at the lower clock frequency of the PCLKR and PCLKF signals. However, the higher clock frequency sampling consumes more power. Consequently, the CA receiver circuit 360 may be operated to sample the CAn signals at the lower clock frequency of the PCLKR and PCLKF signals when lower power consumption is desired. Operating the CA receiver circuit 360 to sample the CAn signal at one of the two different clock frequencies allows flexibility to tailor the sampling of the CAn signal for better timing margin or lower power consumption as needed.

In some embodiments of the disclosure, the sampler circuits 348, 352, and 354 of the CS receiver circuit 340 and/or one or more of the sampler circuits 368, 372, and 374 of the CA receiver circuit 360 may be implemented with a D flip flop circuit clocked by differential clock signals. Such circuits are well known in the art, and in the interest of brevity, such circuits have not been described in detail herein.

Figure 4:
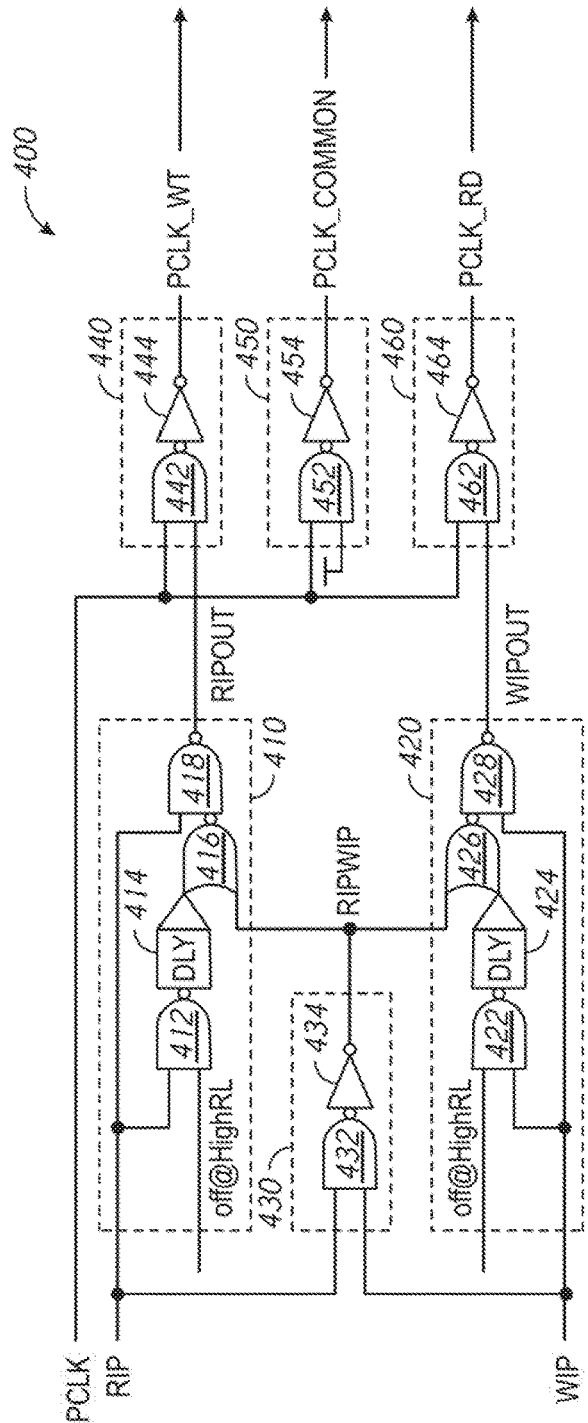
FIG. 4 is a schematic diagram of a clock blocking circuit according to an embodiment of the invention.

FIG. 4 is a schematic diagram of a clock blocking circuit 400 according to an embodiment of the invention. The clock blocking circuit 400 may be included in the clocking control circuit 250 of FIG. 2 in some embodiments of the disclosure.

The clock blocking circuit 400 includes a write clock control logic circuit 410 and a read clock control logic circuit 420. The write clock control logic circuit 410 receives a control signal RIP that is active while a read operation is in progress and further receives a control signal HighRL that disables the write clock control for high read latency operation. The RIP signal may be provided by latency control circuit, for example, by the latency control circuit 240 of FIG. 2. A high read latency operation is indicated when the HighRL signal has a low logic level. The write clock control logic circuit 410 further receives a control signal RIPWIP that is active when both read and write operations are concurrently in progress. The RIPWIP signal is provided by AND logic 430. The AND logic 430 includes a NAND logic circuit 432 and an inverter circuit 434. The NAND logic circuit 432 receives the RIP signal and receives a control signal WIP that is active while a write operation is in progress.

The write clock control logic circuit 410 includes NAND logic circuit 412 that receives the RIP signal and the HighRL signal and provides an output resulting from a NAND logic operation of the RIP and HighRL signals. The output of the NAND logic circuit 412 is provided to a delay circuit 414 that provides the output of the NAND logic circuit 412 with a delay to NOR logic circuit 416. The NOR logic circuit 416 provides an output resulting from a NOR logic operation of the output of the delay circuit 414 and the RIPWIP signal. The write clock control logic circuit 410 further includes NAND logic circuit 418 that receives the RIP signal and an output from the NOR logic circuit 416. The output RIPOUT of the NAND logic circuit 418 results from a NAND logic operation of the RIP signal and the output of the NOR logic circuit 416.

The read clock control logic circuit 420 receives the WIP signal and further receives the HighRL signal. The WIP signal may be provided by a latency control circuit, for example, the latency control circuit 240 of FIG. 2. The read clock control logic circuit 420 further receives the RIPWIP signal from the AND logic 430. The read clock control logic circuit 420 includes NAND logic circuit 422 that receives the WIP signal and the HighRL signal and provides an output resulting from a NAND logic operation of the WIP and HighRL signals. The output of the NAND logic circuit 422 is provided to a delay circuit 424 that provides the output of the NAND logic circuit 422 with a delay to NOR logic circuit 426. The NOR logic circuit 426 provides an output resulting from a NOR logic operation of the output of the delay circuit 424 and the RIPWIP signal. The read clock control logic circuit 420 further includes NAND logic circuit 428 that receives the WIP signal and an output from the NOR logic circuit 426. The output WIPOUT of the NAND logic circuit 428 results from a NAND logic operation of the WIP signal and the output of the NOR logic circuit 426.

The clock blocking circuit 400 further includes write clock logic 440, common clock logic 450, and read clock logic 460. Each of the write, common, and read clock logic 440, 450, and 460 include respective NAND logic circuits 442, 452, and 462, and include respective inverter circuits 444, 454, and 464. A clock signal PCLK is provided to the write, common, and read clock logic 440, 450, and 460. The PCLK signal may be provided by a clock gating circuit, for example, clock gating circuit 230 of FIG. 2. The write and read clock logic 440 and 460 are also provided a respective control signal. The write clock logic 440 is provided the RIPOUT output from the write clock control logic 410 and the read clock logic 460 is provided the WIPOUT output from the read clock control logic 420. The common clock logic 450 is also provided a high logic level signal, represented in FIG. 4 as an input coupled to a supply voltage. The write clock logic 440 provides a clock signal PCLK_WT that is used during write operations. The read clock logic 460 provides a clock signal PCLK_RD that is used during read operations. The common clock logic 450 provides a clock signal PCLK_COMMON that is used during operations other than read and write operations.

Figure 5:
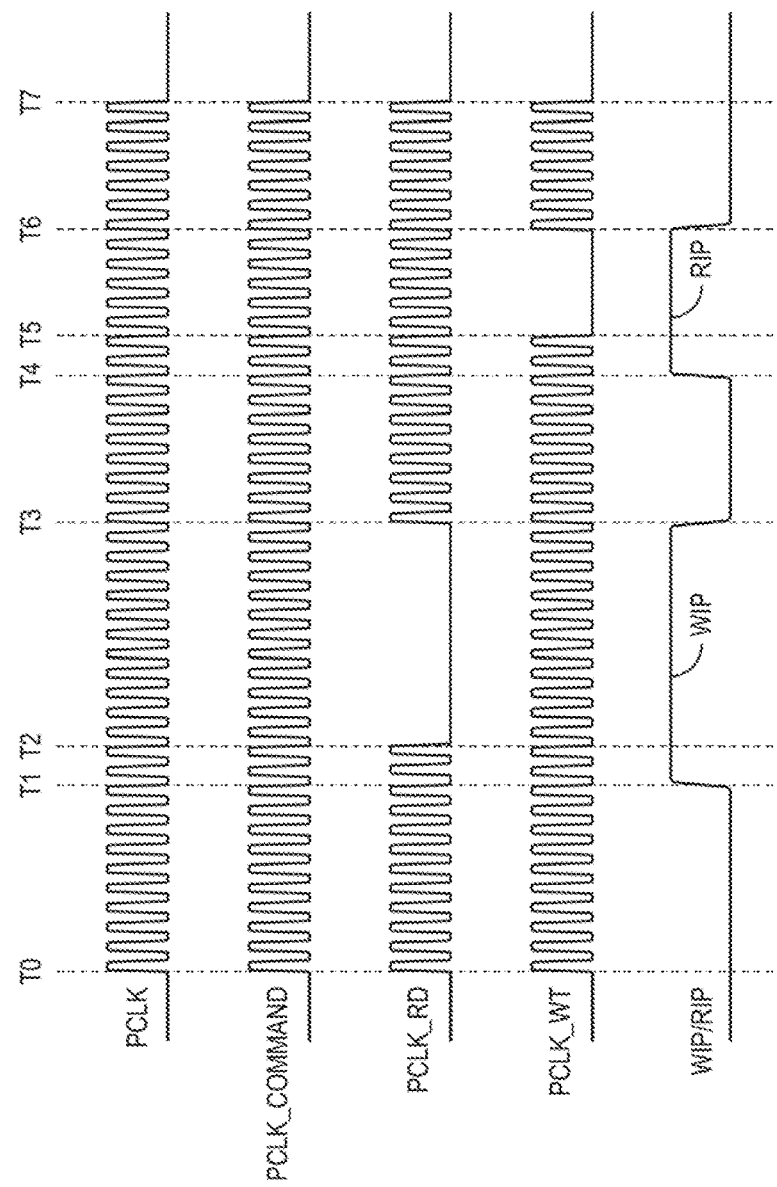
FIG. 5 is a timing diagram showing various signals during operation of the clock blocking circuit of FIG. 4 according to an embodiment of the disclosure.

Operation of the clock blocking circuit 400 will be described with reference to FIGS. 4 and 5. FIG. 5 is a timing diagram showing various signals during operation of the clock blocking circuit 400 according to an embodiment of the disclosure. During the operation described with reference to FIGS. 4 and 5, it is assumed that the HighRL signal is at a high logic level, indicating that a high read latency operation is not being performed.

At time T0, the clock signal PCLK is active to begin clocking between high and low clock levels. With the PCLK signal active, and the RIP signal and WIP signal not active (e.g., the RIP signal and the WIP signal are at a low logic level), the write, common, and read clock logic 440, 450, and 460 provide active PCLK_WT, PCLK_COMMON, and PCLK_RD signals, respectively.

At time T1, an active WIP signal is provided to indicate that a write operation is now in progress. As previously described, the WIP signal becomes active during a write operation, and may be provided by a latency control circuit 240 of FIG. 2. The write operation may be performed based on a write command. The WIP signal causes the read clock control logic circuit 420 to provide a low logic level WIPOUT output, which causes the read clock logic 460 to block the active PCLK signal from being provided as the PCLK_WT signal, and instead provide an inactive PCLK_WT signal at time T2. The resulting inactive PCLK_RD signal is at a low clock level. The delay between when the WIP signal becomes active (at time T1) and when an inactive PCLK_RD signal is provided (at time T2) is based on the delay of the delay circuit 424. For example, the longer the delay of the delay circuit 424, the longer the time between when the WIP signal becomes active and when an inactive PCLK_RD signal is provided (e.g., time between times T1 and T2), and conversely, the shorter the delay of the delay circuit 424, the shorter the time between when the WIP signal becomes active and when an inactive PCLK_RD signal is provided.

Although an inactive PCLK_RD signal is provided at time T2, an active PCLK_WT signal continues to be provided. The active PCLK_WT signal may be used during the write operation that is in progress. The inactive PCLK_RD signal may be provided while a write operation is in progress because the PCLK_RD signal is not needed during the write operation. While the inactive PCLK_RD signal is provided, power consumption is reduced because circuits that would otherwise continue to operate due to an active PCLK_RD signal become inactive and consume little to no power during this time.

At time T3, the WIP signal changes to a low logic level, which indicates that the write operation is no longer in progress. The change of the WIP signal to a low logic level causes the read clock control logic circuit 420 to provide a high logic level WIPOUT output, which causes the read clock logic 460 to provide an active PCLK_RD signal at time T3. At time T3, active PCLK_WT, PCLK_COMMON, and PCLK_RD signals are provided by the write, common, and read clock logic 440, 450, and 460, respectively.

At time T4, an active RIP signal is provided to indicate that a read operation is in progress. As previously described, the RIP signal becomes active during a read operation and may be provided by a latency control circuit 240 of FIG. 2. The read operation may be performed based on a read command. The RIP signal causes the write clock control logic circuit 410 to provide a low logic level RIPOUT output, which causes the write clock logic 440 to block an active PCLK signal from being provided as the PCLK_WT, and instead provide an inactive PCLK_WT signal at time T5. The resulting inactive PCLK_WT signal is at a low clock level. The delay between when the RIP signal becomes active (at time T4) and when an inactive PCLK_WT signal is provided (at time T5) is based on the delay of the delay circuit 414. For example, the longer the delay of the delay circuit 414, the longer the time between when the RIP signal becomes active and when an inactive PCLK_WT signal is provided (e.g., time between times T4 and T5), and conversely, the shorter the delay of the delay circuit 414, the shorter the time between when the RIP signal becomes active and when an inactive PCLK_WT signal is provided.

Although an inactive PCLK_WT signal is provided at time T5, an active PCLK_RD signal continues to be provided. The active PCLK_RD signal may be used during the read operation that is in progress. The inactive PCLK_WT signal may be provided while a read operation is in progress because the PCLK_WT signal is not needed during the read operation. While the inactive PCLK_WT signal is provided, power consumption is reduced because circuits that would otherwise continue to operate due to an active PCLK_WT signal become inactive and consume little to no power during this time.

At time T6, the RIP signal changes to a low logic level, which indicates that the read operation is no longer in progress. The change of the RIP signal to a low logic level causes the write control logic circuit 410 to provide a high logic level RIPOUT output, which causes the write clock logic 440 to provide an active PCLK_WT signal at time T6. At time T6, active PCLK_WT, PCLK_COMMON, and PCLK_RD signals are provided by the write, common, and read clock logic 440, 450, and 460, respectively.

Figure 6:
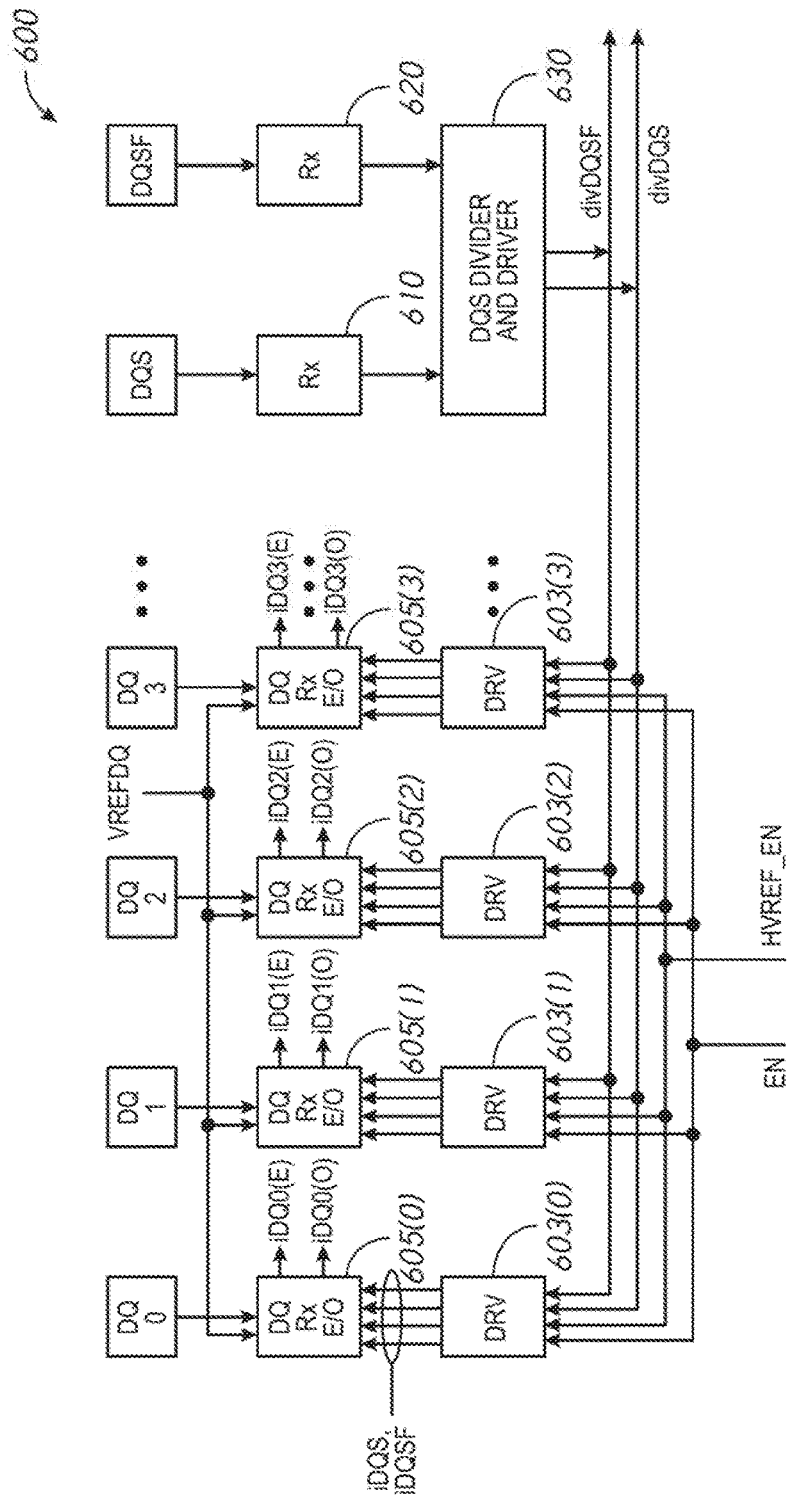
FIG. 6 is a block diagram of a data input block according to an embodiment of the disclosure.

FIG. 6 is a block diagram of a data input block 600 according to an embodiment of the disclosure. The data input block 600 may be included in the input/output circuit 117 of the semiconductor device 110 in some embodiments of the disclosure.

The data input block 600 includes data receiver circuits 605(0)-605(3) that receive data from respective data terminals DQ0-DQ3. The data receiver circuits 605(0)-605(3) sample the data from the respective data terminals DQ0-DQ3 and provide respective internal data signals iDQn(E) and iDQn(O) when activated. The data receiver circuits 605(0)-605(3) compare a voltage of the data from the respective data terminal DQ0-DQ3 to a data reference voltage VREFDQ and provide respective internal data signals iDQn(E) and iDQn(O) based on the comparison. The iDQn(E) and iDQn(O) signals have the logic level of the data provided at the data terminals DQ0-DQ3 when sampled by the respective data receiver circuit 605(0)-605(3). The iDQn(E) and iDQn(O) signals may be provided to internal circuits that write the data to a memory array. Driver circuits 603(0)-603(3) provide driver signals iDQS and iDQSF to a respective data receiver circuit 605(0)-605(3) to activate the respective data receiver circuit. The driver circuits 603(0)-603(3) receive internal strobe signals divDQS and divDQSF, and enable signals EN and HVREF_EN, and provide iDQS and iDQSF signals to control activation of the data receiver circuits 605(0)-605(3) accordingly.

The data input block 600 further includes strobe receiver circuits 610 and 620. The strobe receiver circuit 610 receives a strobe signal DQS from a DQS terminal and the strobe receiver circuit 620 receives a strobe signal DQSF from a DQSF terminal. The DQS signal and the DQSF signal are complementary. For example, when the DQS signal has a high clock level the DQSF signal has a low clock level, and when the DQS signal has a low clock level the DQSF signal has a high clock level. The strobe receiver circuits 610 and 620 provide the DQS and DQSF signals to a divider and driver circuit 630. The divider and driver circuit 630 provides internal strobe signals divDQS and divDQSF based on the DQS and DQSF signals, but having a lower clock frequency than the DQS and DQSF signals. The divDQS and divDQSF signals are provided by the divider and driver circuit 630 to the driver circuits 603(0)-603(3). In some embodiments of the disclosure the divider and driver circuit 630 provides divDQS and divDQSF signals having one-half the clock frequency of the DQS and DQSF signals.

As will be described in greater detail below, the driver circuits 603(0)-603(3) provide driver signals iDQS and iDQSF to selectively enable the data receiver circuits 605(0)-605(3) to operate with different voltage levels of the VREFDQ voltage. For example, the data receiver circuits 605(0)-605(3) may be enabled to operate with a first voltage level of the VREFDQ voltage and may be also enabled to operate with a second voltage level of the VREFDQ voltage that is higher than the first voltage level.

The embodiment of the data input block 600 of FIG. 6 is shown to receive four bits of data DQ0-DQ3. It will be appreciated that greater or fewer bits of data may be received in other embodiments of the data input blocks without departing from the scope of the disclosure. The embodiment of the data input block 600 of FIG. 6 is also shown to receive complementary strobe signals DQS and DQSF. It will be appreciated that greater or fewer strobe signals may be received in other embodiments of the data input blocks without departing from the scope of the disclosure.

Figure 7:
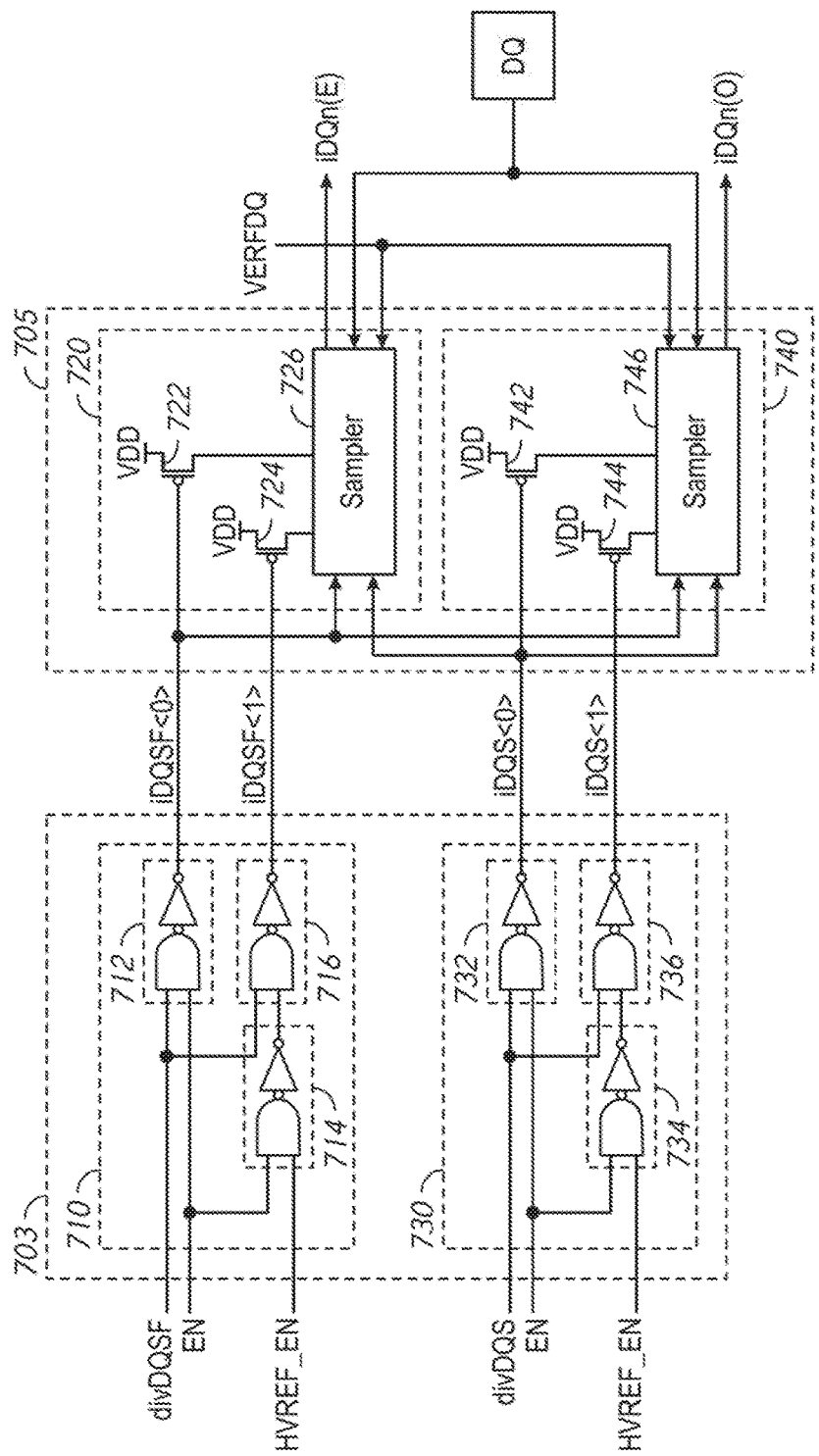
FIG. 7 is a schematic diagram of a driver circuit and data receiver circuit according to an embodiment of the disclosure.

FIG. 7 is a schematic diagram of a driver circuit 703 and data receiver circuit 705 according to an embodiment of the disclosure. The driver circuit 703 may be used as the driver circuit 603 of the data block 600 of FIG. 6 in some embodiments of the disclosure. The data receiver circuit 705 may be used as the data receiver circuit 605 of the data block 600 of FIG. 6 in some embodiments of the disclosure.

The driver circuit 703 includes driver logic circuits 710 and 730. The driver logic circuit 710 provides driver signals iDQSF<0> and iDQSF<1> based on the internal strobe signals divDQSF, and enable signals EN and HVREF_EN. The driver logic circuit 710 includes AND logic 712, and further includes AND logic 714 and 716. Each of the AND logic 712, 714, and 716 include a NAND logic circuit and an inverter circuit. The AND logic 712 provides the internal strobe signal divDQSF as the driver signal iDQSF<0> when the EN signal is active (e.g., EN active when a high logic level). The AND logic 714 and 716 are coupled in series and provide the internal strobe signal divDQSF as the driver signal iDQSF<1> when both the EN signal is active and the HVREF_EN signal is active (e.g., HVREF_EN is active when a high logic level).

The driver logic circuit 730 provides driver signals iDQS<0> and iDQS<1> based on the internal strobe signals divDQS, and enable signals EN and HVREF_EN. The driver logic circuit 730 includes AND logic 732, and further includes AND logic 734 and 736. Each of the AND logic 732, 734, and 736 include a NAND logic circuit and an inverter circuit. The AND logic 732 provides the internal strobe signal divDQS as the driver signal iDQS<0> when the EN signal is active. The AND logic 734 and 736 are coupled in series and provide the internal strobe signal divDQS as the driver signal iDQS<1> when both the EN signal is active and the HVREF_EN signal is active.

The data receiver circuit 705 includes a sampler block 720 and a sampler block 740. The sampler block 720 includes a sampler circuit 726 and power switches 722 and 724. When activated, the sampler circuit 726 samples data provided on data terminal DQ by comparing a voltage of the data from the data terminal DQ to a data reference voltage VREFDQ. The sampler circuit 726 provides internal data signal iDQn(E) having a voltage representing the logic level of the data sampled. Activation of the sampler circuit 726 is controlled by the driver signals iDQS<0> and iDQSF<0>. For example, the sampler circuit 726 may be activated when the iDQS<0> signal is a high logic level, and due the complementary nature, when the iDQSF<0> signal is a low logic level.

Power is provided to the sampler circuit 726 through the power switches 722 and 724. In particular, the power switch 722 provides power from a power supply VDD when activated by the iDQSF<0> signal and the power switch 724 provides power from the power supply VDD when activated by the iDQSF<1> signal. In the embodiment of FIG. 7, the power switch 722 is activated by a low logic level iDQSF<0> signal and the power switch 724 is activated by a low logic level iDQSF<1> signal. The power switch 722 may be activated for the sampler circuit 726 to operate with a first voltage level of the VREFDQ voltage. The power switch 724 may be activated in addition to the power switch 722 for the sampler circuit 726 to operate with a second voltage level of the VREFDQ voltage that is higher than the first voltage level. In this manner, the sampler circuit 726 may be selectively provided power to operate with different voltage levels of the VREFDQ voltage.

The sampler block 740 is similar to the sampler block 720. The sampler block 740 includes a sampler circuit 746 and power switches 742 and 744. When activated, the sampler circuit 746 samples data provided on data terminal DQ by comparing a voltage of the data from the data terminal DQ to a data reference voltage VREFDQ, and provides internal data signal iDQn(O) having a voltage representing the logic level of the data sampled. Activation of the sampler circuit 746 is controlled by the driver signals iDQS<0> and iDQSF<0>. For example, the sampler circuit 746 may be activated when the iDQSF<0> signal is a high logic level, and due the complementary nature, when the iDQS<0> signal is a low logic level.

Power is provided to the sampler circuit 746 through the power switches 742 and 744. The power switch 742 provides power from the power supply VDD when activated by the iDQS<0> signal and the power switch 744 provides power from the power supply VDD when activated by the iDQS<1> signal. In the embodiment of FIG. 7, the power switch 742 is activated by a low logic level DQS<0> signal and the power switch 744 is activated by a low logic level DQS<1> signal. The power switch 742 may be activated for the sampler circuit 746 to operate with the first voltage level of the VREFDQ voltage. The power switch 744 may be activated in addition to the power switch 742 for the sampler circuit 746 to operate with the second voltage level of the VREFDQ voltage. In this manner, the sampler circuit 746 may be selectively provided power to operate with different voltage levels of the VREFDQ voltage.

The power switches 722, 724, 742, and 744 are shown in FIG. 7 as p-channel field effect transistors. However, in other embodiments of the disclosure, the power switches 722, 724, 742, and 744 may be a different type of transistor, for example, an n-channel field effect transistor, other type of transistor.

In operation, the sampler circuits 726 and 746 are enabled for operation when the EN signal is active. The active EN signal causes the AND logic 712 to provide the divDQSF signal as the iDQSF<0> signal to the sampler blocks 720 and 740, and also causes the AND logic 732 to provide the divDQS signal as the iDQS<0> signal to the sampler blocks 720 and 740. As previously described, the iDQS<0> and iDQSF<0> signals control activation of the sampler circuits 726 and 746. Understanding that the iDQS<0> and iDQSF<0> signals are complementary because of the complementary nature of the divDQS and divDQSF signals, one sampler circuit 726 or 746 is activated at a time.

For example, when the iDQS<0> signal is a high logic level (and therefore the iDQSF<0> signal is at a low logic level), the sampler circuit 726 is activated to sample data provided to the data terminal DQ, and provide corresponding internal data iDQn(E) having a voltage representing the logic level of the sampled data. The power switch 722 provides power to the sampler circuit 726 during this time due to the low logic level iDQSF<0> signal. Additionally, while the iDQS<0> signal is a high logic level, the sampler circuit 746 is not activated. In contrast, when the iDQS<0> is a low logic level (and therefore the iDQSF<0> signal is at a high logic level), the sampler circuit 726 is not activated. The sampler circuit 746, however, is activated to sample data provided to the data terminal DQ, and provide corresponding internal data iDQn(O) having a voltage representing the logic level of the sampled data. The power switch 742 provides power to the sampler circuit 746 during this time due to the low logic level iDQS<0> signal.

As the divDQS and divDQSF signals periodically clock between high and low clock levels, the sampler circuits 726 and 746 are alternately activated to sample data at the data terminal DQ and alternately provide the internal data iDQn (E) and iDQn(O). Due to the alternating activation of the sampler circuits 726 and 746 during one clock period of the divDQS and divDQSF signals each sampler circuit 726 and 746 samples data at the data terminal DQ and provides iDQn(E) and iDQn(O) data, respectively.

As previously described, the sampler circuits 726 and 746 may be selectively provided power to operate with different voltage levels of the VREFDQ voltage. The sampler circuits 726 and 746 operate with the first voltage level of the VREFDQ voltage when the EN signal is active. However, when operating with the second voltage level of the VREFDQ voltage that is higher than the first voltage level, an active HVREF_EN signal may be provided (when the EN signal is also active). The active HVREF_EN causes the AND logic 714 and 716 to provide the divDQSF signal as the iDQSF<1> signal to the sampler circuit 720, and also causes the AND logic 734 and 736 to provide the divDQS signal as the iDQS<1> signal to the sampler circuit 740.

As a result, when the divDQSF signal is a low logic level, the power switch 724 is activated (by a low logic level iDQSF<1> signal) to provide power from the power supply VDD to the sampler circuit 726 in addition to the power provided to the sampler circuit 726 by the activated power switch 722 (which is also activated by the low logic level divDQSF signal that causes a low logic level iDQSF<0> signal). When the divDQS signal is a low logic level, the power switch 744 is activated (by a low logic level iDQS<1> signal) to provide power from the power supply VDD to the sampler circuit 746 in addition to the power provided to the sampler circuit 746 by the activated power switch 742 (which is also activated by the low logic level divDQS signal that causes a low logic level iDQS<0> signal).

With power also provided through the power switches 724 and 744 when the samplers 726 and 746 are activated, additional power is provided to the sampler circuits 726 and 746. The additional power provided by the power switches 724 and 744 may improve performance of the sampler circuits 726 and 746. For example, using a relatively high VREFDQ voltage may cause circuits of the sampler circuits 726 and 746 to have slower response time (e.g., higher resistance, lower current, etc.) due to decreased voltage differences applied to the circuits, for example, decreased gate-source voltage for field-effect transistors. Providing the additional power, for example, through activation of power switches 724 and 744 may increase current drive through the circuits, thus, improving performance of the sampler circuits 726 and 746. When a relatively low VREFDQ voltage is used, however, providing additional power to the sampler circuits 726 and 746 may not be needed for sufficient performance of the sampler circuits 726 and 746. Thus, power consumption is reduced compared to providing additional power to the sampler circuits 726 and 746 when used with the relatively high VREFDG voltage.

Figure 8:
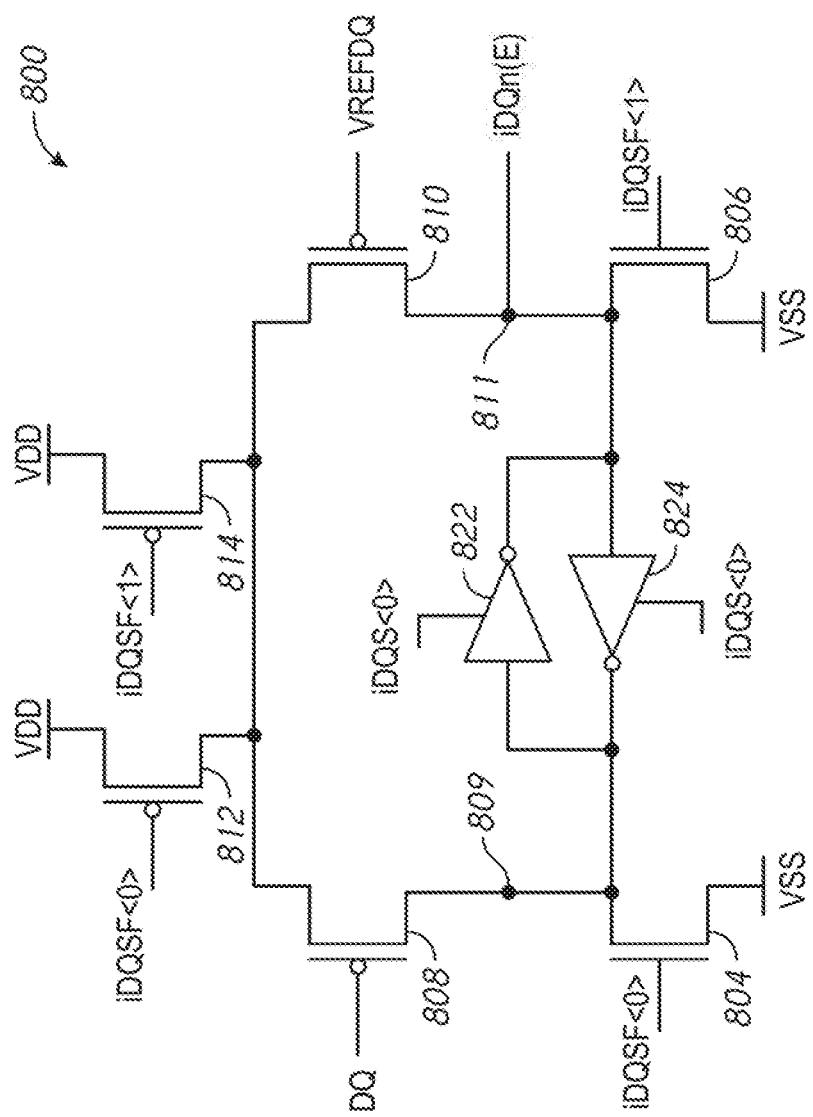
FIG. 8 is a schematic diagram of a sampler circuit according to an embodiment of the disclosure.

FIG. 8 is a schematic diagram of a sampler block 800 according to an embodiment of the disclosure. The sampler block 800 may be used for the sampler block 720 and 740 of FIG. 7 in some embodiments of the disclosure.

The sampler block 800 includes input transistors 808 and 810 and inverter circuits 822 and 824. The input transistors 808 and 810 are coupled together and coupled to the inverter circuits 822 and 824 as a differential amplifier and a latch circuit. The sampler circuit 800 further includes precharge transistors 804 and 806 coupled between drains of the input transistors 808 and 810 and a reference voltage (e.g., ground). The precharge transistors 808 and 810 are activated to precharge output nodes 809 and 811 at drains of the input transistors 808 and 810. Power switches 812 and 814 provide power to sources of the input transistors 808 and 810.

In operation, the sampler block 800 is activated when the iDQS<0> signal is at a high logic level (and the complementary signal iDQSF<0> is at a low logic level). The high logic level iDQS<0> signal activates the inverter circuits 822 and 824, and the low logic level iDQSF<0> activates the power switch 812 to provide power from the power supply VDD to the input transistors 808 and 810. When activated, the sampler block 800 compares a voltage of data DQ provided to a gate of the input transistor 808 to a data reference voltage VREFDQ provided to a gate of the input transistor 810. Based on the voltage of the data DQ relative to the VREFDQ voltage, one of the input transistors will initially be activated to develop complementary voltages at the output nodes 809 and 811, and eventually cause the inverter circuits 822 and 824 to latch the complementary voltages at the output nodes 809 and 811. The output node 811 provides the internal data iDQn(E). The output node 809 provides the complement to the internal data iDQn(E).

The power switch 814 may be activated by a low logic level iDQSF<1> signal to increase the power provided to the input transistors 808 and 810. The iDQFS<1> signal may be provided, for example, a driver circuit such as driver logic circuit 710 of FIG. 7. As previously described, the power provided may be changed when operating with different voltage levels of the VREFDQ voltage. For example, with reference to the sampler block 800, the power switch 812 is activated to provide power when the sampler circuit is operating with a first VREFDQ voltage. The power switch 814 may be also activated to provide greater power to the sampler block 800 when operating with a second VREFDQ voltage that is greater than the first VREFDQ voltage. For example, the sampler block 800 may be activated with the power switch 812 to provide power when using a VREFDQ voltage in the range of 200-300 mV. The power switch 814 may be additionally activated to provide power when using a VREFDQ voltage in the range of 450-500 mV.

The sampler block 800 is deactivated when the iDQS<0> signal is at a low logic level (and the complementary signal iDQSF<0> is at a high logic level). During deactivation of the sampler block 800, the precharge transistors 804 and 806 are activated by the high logic level iDQSF<0> signal to precharge the output nodes 809 and 811 to the reference voltage, such as ground.

The power switch 814 may be activated in addition to the power switch 812 in some embodiments of the disclosure to increase the power provided. In other embodiments of the disclosure the power switch 814 is activated alternatively to the power switch 812 to increase the power provided. The power switches 812 and 814 may have the same transistor characteristics (e.g., transistor dimensions, process profile, threshold voltage, impedance, etc.). In such an embodiment of the disclosure, activation of the power switch 814 in addition to activation of the power switch 812 will increase the power provided. The power switches 812 and 814 may have different transistor characteristics. For example, the characteristics of the power switch 814 may provide greater power from the power supply VDD than the power switch 812 when activated. In such an embodiment of the disclosure, the power switch 814 may be activated instead of power switch 812 to increase power provided.

The previous example described operation with regards to activation when the iDQS<0> signal is at a high logic level and the iDQSF<0> signal is at a low logic level, for example, when used as the sampler block 720 of FIG. 7. However, the sampler block 800 may also be used as the sampler block 740 of FIG. 7 by changing the driver signals provided to the inverter circuits 822 and 824, to the power switches 812 and 814, and to the precharge transistors 804 and 806. In particular, the iDQSF<0> signal is provided to the inverter circuits 822 and 824, the iDQS<0> and iDQS<1> signals are provided to the power switches 812 and 814, and the iDQS<0> signal is also provided to the precharge transistors 804 and 806 when the sampler block 800 is used as the sampler block 740.

Embodiments of the disclosure may be implemented individually or in combination with one another to provide reconfigurable input circuitry. For example, one or more of the input signal blocks 200 and 300, the clock blocking circuit 400, the data input block 600, the driver circuit 703, the data receiver circuit 705, and/or the sampler block 800 may be implemented individually or in combination in different embodiments of the disclosure. Thus, the disclosure is not intended to be limited to any particular combination of the embodiments described herein.

From the foregoing it will be appreciated that, although specific embodiments of the disclosure have been described herein for purposes of illustration, various modifications may be made without deviating from the spirit and scope of the disclosure. Accordingly, the scope disclosure should not be limited by any of the specific embodiments described herein.

What is claimed is:

1. An apparatus, comprising:
   a command decoder configured to receive command signals and provide internal control signals to cause an operation to be performed, wherein the operation to be performed includes at least a read operation and a write operation; and
   a clock blocking circuit, the clock block circuit configured to receive a first progress signal indicative of a read operation in progress, a second progress signal indicative of a write operation in progress, and a clock signal, the clock blocking circuit configured to provide an active read clock signal, an active write clock signal, and an active common clock signal responsive to an active clock signal when the first and second progress signals indicate neither a write nor read operation is in progress, and further configured to provide the active read and active common clock signals and an inactive write clock signal when the first progress signal indicates a read operation in progress and to provide the active write and active common clock signals and an inactive read clock signal when the second progress signal indicates a write operation is in progress.

2. The apparatus of claim 1, wherein the clock blocking circuit comprises:
   write clock logic configured to receive the clock signal and provide an active write clock signal responsive to an active clock signal and the second progress signal indicating a write operation in progress and to provide an inactive write clock signal responsive to an active clock signal and the first progress signal indicating a read operation in progress;
   common clock logic configured to receive the clock signal and provide an active common clock signal responsive to an active clock signal; and
   read clock logic configured to receive the clock signal and provide an active read clock signal responsive to an active clock signal and the first progress signal indicating a read operation in progress and to provide an inactive read clock signal responsive to an active clock signal and the second progress signal indicating a write operation in progress.

3. The apparatus of claim 2, further comprising:
   AND logic configured to receive the first and second progress signals and configured to provide a control signal indicative of both the read and write operations in progress;

write clock control logic configured to receive the first progress signal and the control signal from the AND logic and configured to provide a write clock control signal to the write clock logic to control provision of an active write clock signal or an inactive write clock signal based on the first progress signal and the control signal from the AND logic; and read clock control logic configured to receive the second progress signal and the control signal from the AND logic and configured to provide a read clock control signal to the read clock logic to control provision of an active read clock signal or an inactive read clock signal based on the second progress signal and the control signal from the AND logic.

4. The apparatus of claim 3, wherein the write clock control logic includes a delay circuit configured to provide a delay to the first progress signal and control a delay time between when the first progress signal changes to indicate a read operation in progress and when the write clock control logic provides the write clock control signal to control the write clock logic to provide an inactive write clock signal while receiving the active clock signal.

5. The apparatus of claim 2, wherein the clock blocking circuit is further configured to provide the active read, active write, and active common clock signals when the first and second progress signals indicate both a read operation and write operation are in progress.

6. The apparatus of claim 2, further comprising:
a first control circuit configured to provide a control signal indicative of both the read and write operations in progress;
a second control circuit configured to provide a write clock control signal to the write clock logic based on the first progress signal and the control signal; and
a third control circuit configured to provide a read clock control signal to the read clock logic based on the second progress signal and the control signal from the AND logic.

7. The apparatus of claim 6, wherein the second control circuit is further configured to control provision by the write clock logic of an active write clock signal or an inactive write clock signal.

8. The apparatus of claim 6, wherein the third control circuit is further configured to control provision by the read clock logic of an active read clock signal or an inactive read clock signal.

9. The apparatus of claim 1, wherein the clock blocking circuit comprises:
write clock logic configured to receive the clock signal and provide the inactive write clock signal when the first progress signal indicates a read operation in progress; and
read clock logic configured to receive the clock signal and provide the inactive read clock signal when the second progress signal indicates a write operation in progress.

10. The apparatus of claim 9, further comprising:
write clock control logic including a delay circuit configured to provide a delay to the first progress signal; and
read clock control logic including a delay circuit configured to provide a delay to the second progress signal.

11. An apparatus, comprising:
a command decoder configured to receive command signals and provide internal control signals to cause an operation to be performed, wherein the operation to be performed includes at least a read operation and a write operation; and a clock blocking circuit, the clock block circuit configured to receive a read in progress signal, a write in progress signal, and a clock signal, the clock blocking circuit configured to provide an active read clock signal corresponding to the read in progress signal indicating a read operation in progress and to provide an active write clock signal corresponding to the write in progress signal indicating a write operation in progress.

12. The apparatus of claim 11, wherein the clock blocking circuit comprises:
write clock logic configured to receive the clock signal and provide an active write clock signal responsive to an active clock signal and the write in progress signal indicating a write operation in progress and to provide an inactive write clock signal responsive to an active clock signal and the read in progress signal indicating a read operation in progress.

13. The apparatus of claim 11, wherein the clock blocking circuit comprises:
common clock logic configured to receive the clock signal and provide an active common clock signal responsive to an active clock signal.

14. The apparatus of claim 11, wherein the clock blocking circuit comprises:
read clock logic configured to receive the clock signal and provide an active read clock signal responsive to an active clock signal and the read in progress signal indicating a read operation in progress and to provide an inactive read clock signal responsive to an active clock signal and the write in progress signal indicating a write operation in progress.

15. The apparatus of claim 11, further comprising:
write clock control logic including a delay circuit configured to provide a delay to the read in progress signal and control a delay time between when the read in progress signal changes to indicate a read operation in progress and when the write clock control logic provides a write clock control signal,
wherein the clock blocking circuit further comprises write clock logic configured to provide an inactive write clock signal when the read in progress signal indicates a read operation in progress, while receiving an active clock signal.

16. The apparatus of claim 11, wherein the clock blocking circuit is further configured to provide an active common clock signal corresponding to either the read in progress signal indicating a read operation in progress or the write in progress signal indicating a write operation in progress, and
wherein the clock blocking circuit is further configured to provide the active read, active write, and active common clock signals when the read in progress signal and the write in progress signal indicate both a read operation and write operation are in progress.

17. An apparatus, comprising:
a command decoder configured to receive command signals and provide internal control signals to cause an operation to be performed, wherein the operation to be performed includes at least a read operation and a write operation; and a clock blocking circuit, the clock block circuit configured to receive a first progress signal indicative of a read operation in progress, a second progress signal indicative of a write operation in progress, and a clock signal, the clock blocking circuit configured to provide an active read clock signal when the first progress signal indicates a read operation in progress and to provide an active write clock signal when the second progress signal indicates a write operation is in progress.

18. The apparatus of claim 17, wherein the clock blocking circuit is further configured to provide the active read clock signal, the active write clock signal, and an active common clock signal responsive to an active clock signal when the first and second progress signals indicate neither the write nor read operation is in progress.

19. The apparatus of claim 18, wherein the clock blocking circuit is further configured to provide the active read and active common clock signals and an inactive write clock signal when the first progress signal indicates the read operation in progress.

20. The apparatus of claim 19, wherein the clock blocking circuit is further configured to provide the active write and active common clock signals and an inactive read clock signal when the second progress signal indicates the write operation is in progress.

* * * * *